United States Patent [19]

Sugata et al.

[11] 4,397,933
[45] Aug. 9, 1983

[54] HYDROGENATED AMORPHOUS SILICON PHOTOCONDUCTIVE LAYER

[75] Inventors: Masao Sugata; Masaki Fukaya, both of Kawasaki; Takashi Nakagiri, Tokyo; Takaaki Yamagata, Yokohama; Yutaka Hirai, Tokyo, all of Japan

[73] Assignee: Canon Kabushiki Kaisha, Tokyo, Japan

[21] Appl. No.: 302,454

[22] Filed: Sep. 15, 1981

Related U.S. Application Data

[63] Continuation of Ser. No. 105,779, Dec. 20, 1979, abandoned.

[30] Foreign Application Priority Data

Dec. 28, 1978 [JP] Japan ................... 53-165850

[51] Int. Cl.$^3$ ............................................. G03G 5/082

[52] U.S. Cl. ........................................ 430/84; 430/95; 430/133; 430/62
[58] Field of Search .................. 430/64, 65, 67, 84, 430/95, 133, 135, 62

[56] References Cited

U.S. PATENT DOCUMENTS 4,147,667  4/1979  Chevallier et al. ................... 430/84
4,217,374  8/1980  Ovshinsky et al. ................... 430/84

Primary Examiner—John E. Kittle
Assistant Examiner—John L. Goodrow
Attorney, Agent, or Firm—Fitzpatrick, Cella, Harper & Scinto

[57] ABSTRACT

The hydrogenated amorphous silicon photoconductive layer has an infrared spectrum containing a peak at $880 \pm 10$ cm$^{-1}$ (intensity of this peak being referred to as $I_A$) and a peak at $970 \pm 10$ cm$^{-1}$ (intensity of this peak being referred to as $I_B$) in the infrared spectrum, the ratio $I_A/I_B$, being not more than 1.0.

9 Claims, 5 Drawing Figures

HYDROGENATED AMORPHOUS SILICON PHOTOCONDUCTIVE LAYER

This is a continuation of application Ser. No. 105,779, filed Dec. 20, 1979, now abandoned.

BACKGROUND OF THE INVENTION

1. Field of the Invention

This invention relates to a hydrogenated amorphous silicon (hereinafter referred to as "a-Si:H") photoconductive layer sensitive to electromagnetic wave such as light (this light broadly means ultraviolet ray, visible ray, infrared ray, X-ray, gamma ray and the like).

2. Description of the Prior Art

Since the structure of an amorphous silicon (hereinafter referred to as "a-Si") layer varies depending upon the type of the process for production and the conditions under which the production is carried out, the resulting electric, optical and photoelectric characteristics also change. Therefore, the reproducibility is very poor.

On the other hand, an a-Si layer composed of silicon only tends to have dangling bonds, vacancies voids and the like on the surface and in the inside which are formed due to a particular structure of an amorphous material, and there are formed energy states due to them. As the result, it is very difficult to form a layer which is of a high reproducibility of electric, optical and photoelectric characteristics.

In particular, such dangling bonds exist inevitably, and therefore, localized states are formed in the band gap as, so-called, gap states.

Therefore, when the a-Si is used, for example, as a photoconductive layer for a solid state imaging device and an image forming member for electrophotography, the photoconductive layer is not always satisfactory with respect to photosensitivity, photo-responsing property, and SN ratio [photo-current (ip)/dark current (id)].

If a-Si layers having fairly few gap states can be formed, the above mentioned problems can be solved and in addition, it becomes possible to introduce impurities and thereby form a desired energy level in the band gap depending upon the type of the impurity. As the result, a-Si layers having desired characteristics and high reproducibility can be produced.

Heretofore, it has been attempted that hydrogen is introduced into the a-Si layer upon forming the layer to eliminate the dangling bonds for the purpose of diminishing the influence of the dangling bonds.

However, at the present time, a simple introduction of hydrogen into an a-Si layer does not succeed in controlling the characteristics and reproducing.

This failure seems to be attributable to the fact that the hydrogen thus introduced is present in the a-Si layer in various forms.

Assuming that hydrogen atom is chemically bonded to silicon atom, they can be in the three types, that is, SiH, $SiH_2$ and $SiH_3$, and further even if hydrogen atom is not chemically bonded to silicon atom, it is considered that electrons contributing to the bond are biased to one of Si atom and H atom and are in an ionized state, or hydrogen is taken in the voids of the layer in a form of $H_2$ or H and adsorbed thereto, and further it is surely considered that the existence state of the hydrogen affects the energy states of a-Si layer.

Therefore, from the point of view of application of a-Si in future as well as studying fundamental physical properties, it is very desirable to study what state in which the hydrogen is taken in is suitable for obtaining an a-Si layer having desired electric, optical and photoelectric characteristics and for producing the a-Si layer with a high reproducibility.

In particular, if such a-Si layer is developed, the a-Si layer can be used for solar cells, photoconductive layers equipped to image forming apparatuses, and photoelectric transducer layers for reading apparatuses with satisfactory electric, optical and photoelectric characteristics, and moreover, the a-Si layer having a large surface area can be produced. This is one of the features of amorphous silicon. In view of the foregoing, development of such a-Si layer contributes to industry to a great extent.

SUMMARY OF THE INVENTION

An object of the present invention is to provide an a-Si:H photoconductive layer having excellent electrical, optical and photoelectric characteristics.

Another object of the present invention is to provide an a-Si:H photoconductive layer having an excellent photosensitivity.

A further object of the present invention is to provide an a-Si:H photoconductive layer having an excellent light responsing property.

Still another object of the present invention is to provide an a-Si:H photoconductive layer having an excellent SN ratio.

A still further object of the present invention is to provide an a-Si:H photoconductive layer which shows excellent characteristics when used as a photoconductive layer for solid state imaging device and imaging tube, or image forming apparatus such as electrophotographic apparatus.

Still another object of the present invention is to provide an a-Si:H photoconductive layer which can be used as a photo-electric transducer layer for a light receiving element or a reading device.

According to the present invention, there is provided an hydrogenated amorphous silicon photoconductive layer which has a peak at $880\pm10$ $cm^{-1}$ (intensity of this peak being referred to as $I_A$) and a peak at $970\pm10$ $cm^{-1}$ (intensity of this peak being referred to as $I_B$) in the infrared spectrum, the ratio, $I_A/I_B$, being not more than 1.0.

According to another aspect of the present invention, the ratio, $I_A/I_B$, is preferably 0.2–1.0.

BRIEF DESCRIPTION OF THE DRAWINGS

FIG. 2 is a cross sectional view of the device of FIG. 1 along line X-Y;

FIG. 5 is the portion in FIG. 4 encircled with a dotted line which is enlarged 5 times.

DESCRIPTION OF THE PREFERRED EMBODIMENTS

Figure 1:
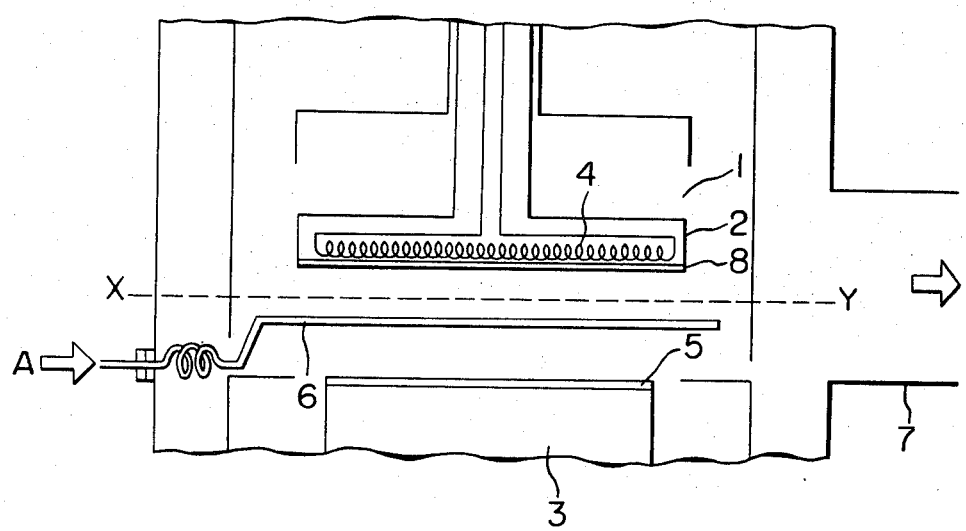
FIG. 1 and FIG. 2 schematically show main portions of a typical device for producing the photoconductive layer of the present invention.

A feature of the present invention is that $\alpha$ ($I_A/I_B$) is not more than 1.0, preferably not more than 0.9, more preferably not more than 0.8.

The a-Si:H photoconductive layer according to the present invention is far better than that in prior art with respect to characteristics, and has a high quality. The a-Si:H photoconductive layer according to the present invention can be widely used in various application fields such as solar cells, solid image sensor, electrophotographic photosensitive member, photo-electric transducer reading apparatus, light receiving member of camera and the like. It is very useful in industry.

According to the present inventors' understanding, the peak A corresponds to the peak of normalized mode of bending mode of $SiH_2$ bond, and the peak B corresponds to the overlap of a peak of normalized mode of deformation mode of SiH bond and a peak with which Si-O bond is concerned. This can be supported by the following.

That is, that peak A is normalized mode of bending mode of $SiH_2$ bond has been reported in the field of amorphous silicon technique. One of the many reports is Phys. Rev. B16, 3556 (1977).

That peak B is the normalized mode of deformation mode of SiH bond can be indicated by the description in Surface Sci., II, 68 (1967) that the infrared absorption spectrum of a silicon wafer treated with a liquid mixture composed of fluoric acid and nitric acid has a peak at $970 \pm 10$ cm$^{-1}$ and this peak is identified as the normalized mode of deformation mode of SiH bond.

On the other hand, it is disclosed in Electrochemi. Soe. 115 (1978) 318 and Phys. Rev. Lett. 20 (1978) 1492 that vibration mode concerned with Si-O appears near the wave number of peak B.

In view of the foregoing, it is considered that the a-Si:H photoconductive layer of the present invention has excellent characteristics because the intensity ratio of peak A to peak B is not more than 1.0 and this means that SiH is very rich in the layer and vacancy, void, and dangling bond are very few or almost negligible and thereby the layer structure is of a high quality.

Moreover the following may show that the a-Si:H photoconductive layer has excellent characteristics.

For example, J. C. Knight: Proceedings of 10th Conference on Solid State Devices, Tokyo, 1978, discloses that infrared absorption spectra of a-Si:H photoconductive layer have, in the wave length region of 1000–800 cm$^{-1}$, an absorption peak due to bending mode of $SiH_2$ at 880 cm$^{-1}$ and another absorption peak due to bending mode of $(SiH_2)n$ at 850 cm$^{-1}$ and as the absorption peak at 850 cm$^{-1}$ decreases, the photoconductive characteristics are improved.

The a-Si:H photoconductive layer according to the present invention does not show an absorption peak at 850 cm$^{-1}$ in the infrared absorption spectrum, or, if any, the peak is almost negligible. Therefore, the a-Si:H photoconductive layer hardly contains $(SiH_2)n$ which appears to be a main factor lowering the photoconductive characteristics.

The foregoing appears to explain the excellent characteristics of the a-Si:H photoconductive layer of the present invention.

According to the present invention, the ratio, $I_A/I_B$, is not more than 1.0, preferably, not more than 0.9 and more preferably, not more than 0.8. Further, the ratio is preferably in the range of 0.2–1.0, more preferably, 0.3–0.9, further more preferably 0.4–0.8.

The a-Si:H photoconductive layer according to the present invention may be produced on an appropriate support by deposition utilizing a glow discharging method or a sputtering method, preferably by a glow discharging method.

As a support used in the present invention, there may be mentioned the following materials as preferable ones:

a conductive support, for example, metals such as Al, Cr, Mo, Au, Ir, Nb, Ta, V, Ti, Pt, Pd and the like and alloys such as alloys containing one of the above mentioned metals and the like;

a conductive support which has the above mentioned metal or alloy on the surface;

an insulating support such as synthetic resin film or sheet of heat resistance, glass, ceramics and the like.

Such support is subjected to a series of cleaning steps before an a-Si:H is deposited thereon. When a metallic support is used, its surface is usually cleaned by etching which is conducted by contacting with an alkaline or acidic solution. After cleaning, the support is dried in a clean atmosphere, and if there is not any other preparing step, it is directly placed in a deposition chamber where a-Si:H is deposited on the support by a discharging phenomenon.

In case of an insulating support, the surface is conductivized if desired. For example, a surface of glass support may be conductivized with $In_2O_3$, $SnO_2$ or the like. When a synthetic resin film such as polyimide film and the like is employed as a support, it is conductivized by depositing a metal such as Al, Ag, Pb, Zn, Ni, Au, Cr, Mo, Ir, Nb, Ta, V, Ti, Pt and the like by vacuum evaporation, electron beam vapor deposition, sputtering or the like, or laminating with a metal.

Shape of the support may be optionally selected. For example, it may be drum, belt, plate or the like. In case of a support for a continuous high speed copying in electrophotography, an endless belt or a drum is desirable.

Thickness of the support may be optionally selected so as to form a desired a-Si:H photoconductive layer. Where the a-Si:H photoconductive layer is required to be flexible, the support is made thinner as far as the function of support is not disturbed. However, thickness of the support is usually not less than 10 microns from the point of view of production, handling and mechanical strength of the support.

An a-Si:H photoconductive layer of a desired thickness of the present invention may be produced by depositing a-Si:H on a support placed in a deposition chamber as shown below.

Pressure in the deposition chamber is first reduced to a predetermined pressure such as $10^{-1}$–$10^{-6}$ Pa and the like, and the support is kept at a predetermined temperature and then a predetermined gas is introduced in the deposition chamber to cause discharge and thereby, a gas plasma atmosphere is formed in a space where at least one of silicon and silicon compounds such as silane is present, in the deposition chamber. The plasma atmosphere is kept under predetermined conditions for a necessary time until a desired thickness of the a-Si:H layer is formed.

As a method of depositing an a-Si:H photoconductive layer on a support by causing discharge to form a plasma atmosphere in a deposition chamber, there may be mentioned a glow discharging method, a sputtering method and the like. In particular, when a glow discharging method is employed, the object of the present invention is satisfactorily attained.

Figure 2:
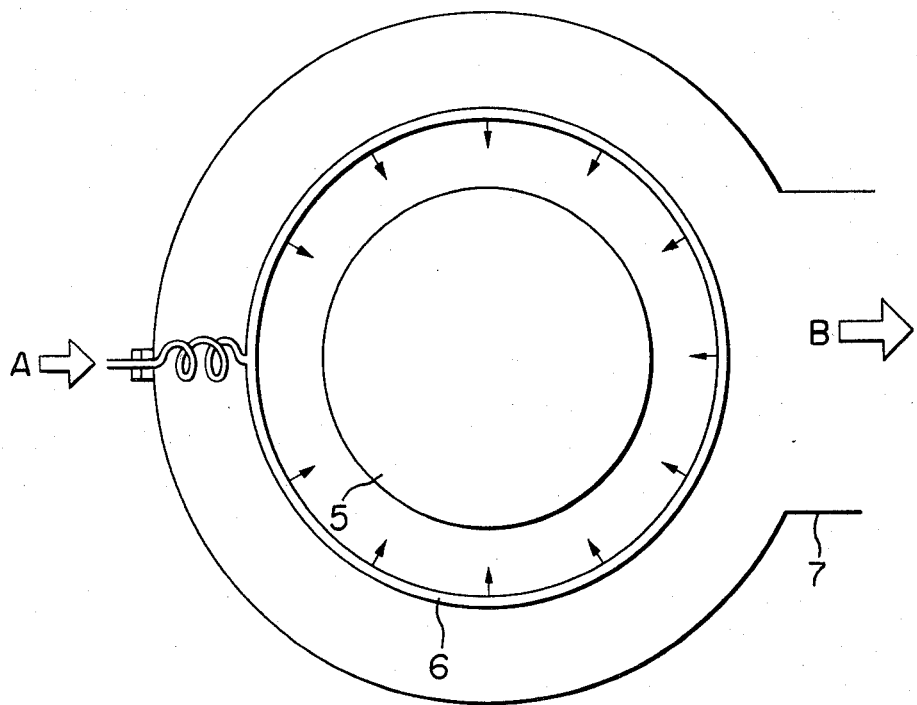

The photoconductive layer of the present invention may be produced by a diode type glow discharge deposition apparatus as illustrated in FIG. 1 and FIG. 2.

FIG. 1 shows a schematic diagram of an important portion of a deposition apparatus for producing the photoconductive layer of the present invention.

In FIG. 1, an anode 2 and a cathode 3 are disposed face to face in a deposition chamber 1 of the glow discharging deposition apparatus. Anode 2 contains a heater 4 which heats a support on which a photoconductive layer is formed. Anode 2 is provided with a mechanism of moving upward and downward so as to adjust the distance between anode 2 and cathode 3.

A holder 8 for holding a support on which a photoconductive layer is formed is removably disposed at a side of anode 2 which faces cathode 3.

A quartz plate 5 is disposed on cathode 3.

A circular gas introducing pipe 6 is disposed between anode 2 and cathode and a gas is introduced into deposition chamber 1 from a gas bomb (not shown) as shown by an arrow "A".

The gas in deposition chamber 1 is exhausted through an exhausting tube 7 as shown by an arrow "B" by an exhausting device (not shown).

FIG. 2 is a cross sectional view of FIG. 1 along the X-Y line, and serves to indicate the position and shape of circular gas introducing pipe 6 and the relation of the pipe 6 with each electrode with respect to size.

Gas introducing pipe 6 is disposed between the two electrodes in such a manner that the gas flow rate is uniform in the whole space between the electrodes and the centre axis the circule of the circular pipe 6 substantially consists with that of cathode 3. The pipe 6 is provided with eleven gas outlets at the same interval as shown by small arrows which allow the gas to flow in the direction to the centre.

In FIG. 2, there are shown eleven gas outlets on the pipe 6, but the number of gas outlet is not always limited to eleven. The pipe 6 is designed in such a way that the size and number of the gas outlets are determined so as to give a desirable conductance and give a substantially uniform gas flow rate in the region between the two electrodes.

Example of dimensions and materials of parts of the apparatus for producing effectively a photoconductive layer is shown below.
Anode 2 . . . 20 cm$\phi$, SUS304
Cathode 3 . . . 17 cm$\phi$, SUS304
Quartz plate 5 . . . 3 mm thick, 17 cm$\phi$ in size
Support holder . . . 0.5 cm thick, 20 cm$\phi$ in size, SUS304

Gas introducing pipe 6:
Diameter of outlet . . . 1 mm$\phi$
Number of outlet . . . 11
Inner diameter of the pipe . . . 2.5 mm
Diameter of the circle . . . 21 cm$\phi$
Distance between anode 2 and cathode 3 . . . 10-90 mm
Distance between gas introducing pipe 6 and the layer forming surface of the support . . . 5-20 mm Under the above conditions, electric power applied to the electrodes for forming a photoconductive layer of the present invention is usually less than 5 W, preferably 0.1 W-1 W, and the gas flow rate is usually 1SCCM-5SCCM. Temperature of the support is usually 100°-300° C.

EXAMPLE

An a-Si:H photoconductive layer was formed on a support in a way as shown below by using the apparatus of FIG. 1.

At first, as a support, a glass substrate of 1.2 mm in thickness and 18 cm × 18 cm in size of Corning No. 7059 (supplied by Corning Glass Works) and this glass substrate was subjected to a surface treatment with a 1% KOH (supplied by Merck) solution, washed with distilled water and deionized water sufficiently, defatted with methyl ethyl ketone, washed with isopropanol, and dried to clean the surface.

Four sheets of glass substrate thus subjected to the surface cleaning were prepared and a photoconductive layer was formed on the surface of each glass substrate.

The support holder of 0.5 cm thick and 20 cm$\phi$ in size of SUS304 was fitted with a glass substrate and was firmly fixed to a predetermined position of an anode 2 of 20 cm$\phi$ in size of SUS304 having a heating mechanism and a mechanism for moving upward and downward.

On cathode 3 of 3 mm thick and 17 cm$\phi$ in size of SUS304 was placed a quartz plate 5 of 3 mm thick and 17 cm$\phi$ in size subjected to the same cleaning treatment as that for the glass substrate.

Then, heater 4 was switched on to heat uniformly the glass substrate and keep at 250°-260° C. while deposition chamber 1 was exhausted until the indication of B-A gauge (supplied by ANELVA) became a pressure of $1.0 \times 10^{-4}$ Pa.

Then a gas mixture of SiH$_4$ and Ar with an SiH$_4$ concentration of 10 vol.% was flown through a circular gas introducing pipe 6 having an inner diameter of pipe of 2.5 mm and eleven outlets for gas of 1 mm$\phi$ each, the diameter of circle of the circular pipe being 21 cm. The exhausting system was adjusted in such a manner that the pressure in deposition chamber 1 became 15 Pa when measured with a manometer (tradename: Baratorn 221 AHS, supplied by MKS Instrument Inc.). The gas flow rate there was 15SCCM at 1.2 kg/cm$^2$.

Then, the distance between anode 2 and cathode 3 was kept at 50 mm and circular gas introducing pipe 6 was grounded at the earth voltage and, at the same time, the distance between the gas outlet of gas introducing pipe 6 and the cathode 3 was kept at 40 mm, and a high frequency electric field was applied between anode 2 and cathode 3 to generate plasma in deposition chamber 1. High frequency electric power applied was kept at 1 W, 2 W, 5 W and 1 W to prepare Samples A, B, C and D, respectively. In addition, with respect to Sample D, the substrate was kept at about 100° C.

Plasma was kept for 10-15 hours to form an a-Si:H layer of 5 microns thick on each substrate.

Upon forming this layer, the gas flow rate control for maintaining the conditions for depositing a-Si:H at constant for a long time was made by using a thermal mass flow meter (5830 type, supplied by Ueshima Corporation).

Samples A'-D' for measuring infrared absorption spectrum were prepared by repeating the procedure for preparing Samples A-D except that as a support there was used a silicon wafer substrate of 500 μm in thick, 7 inches in size subjected to mirror grinding which was sufficiently washed with distilled water and then deionized water, defatted with methyl ethyl ketone, washed with isopropanol and dried.

With respect to Samples A-D, photosensitivity and photo-responsing property were measured and with respect to Samples A'–D', infrared spectrum was measured to calculate "α".

Figure 3:
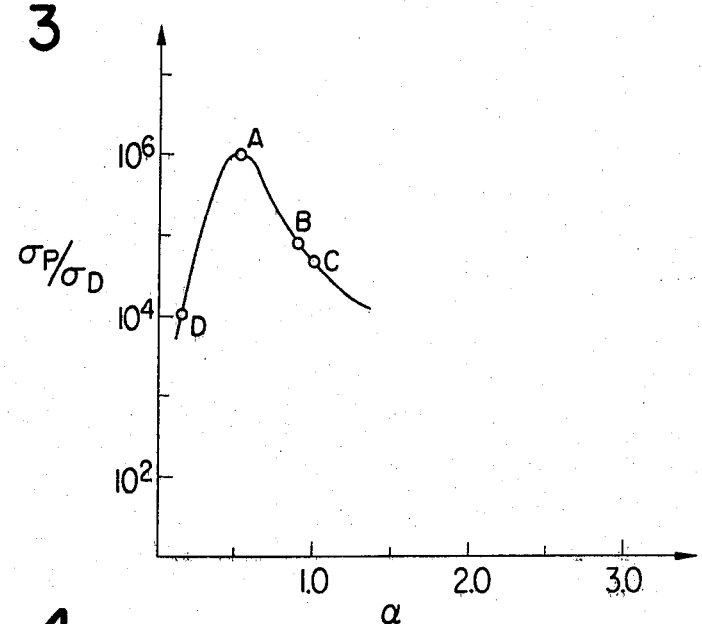
FIG. 3 is a graph showing the relation between $\alpha$ and $p_P/p_D$ concerning characteristics of the photoconductive layer of the present invention.
Figure 4:
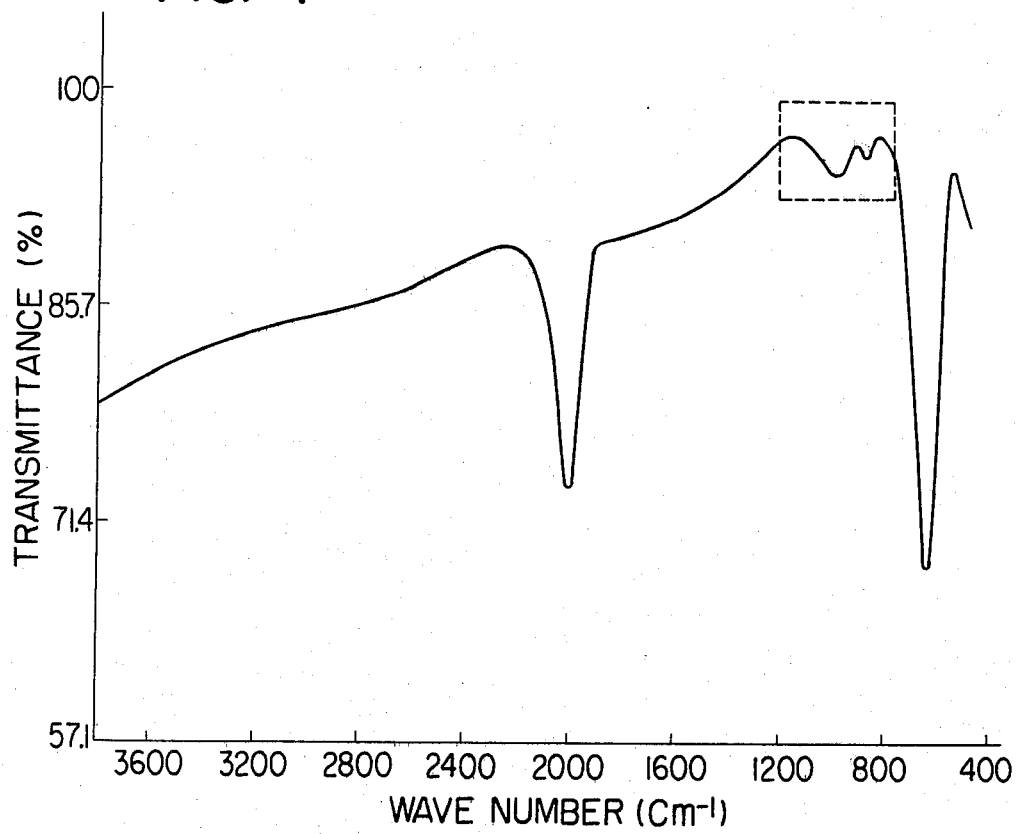
FIG. 4 and FIG. 5 are infrared absorption spectra of Sample A' in the Example of the present invention.
Figure 5:
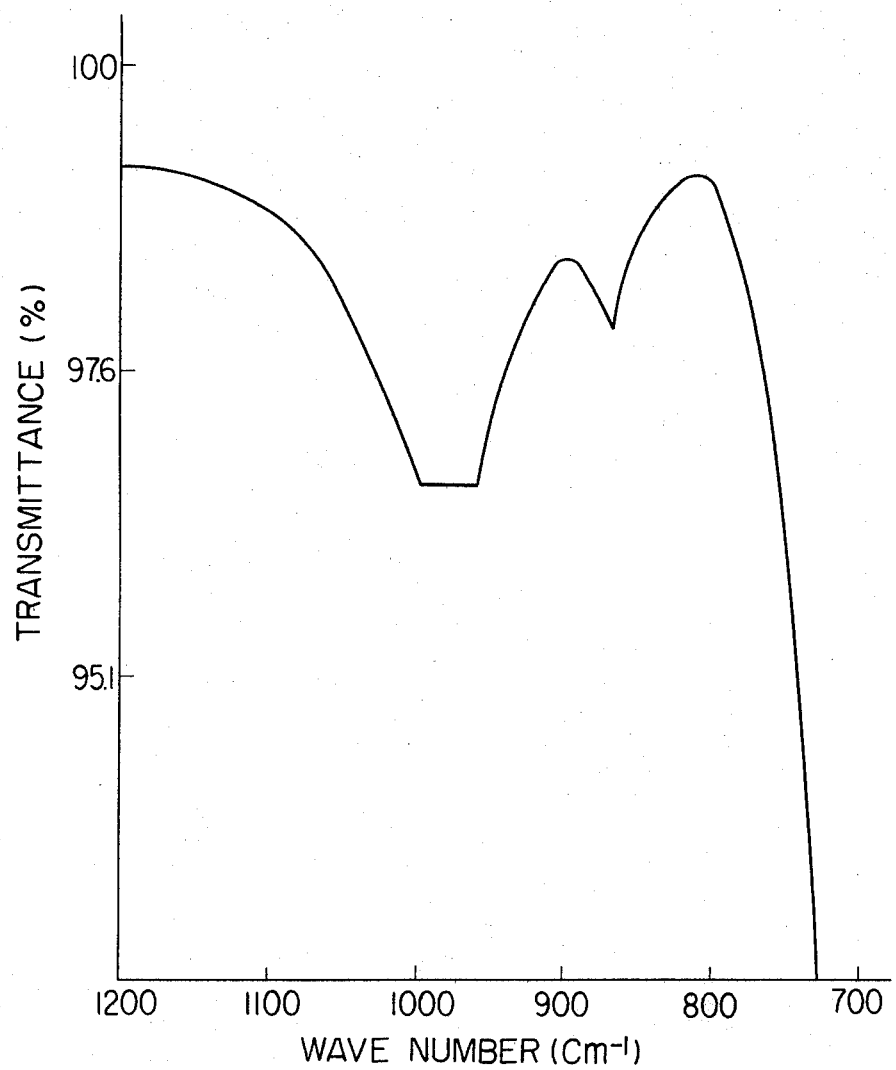

The results are shown in Table 1 and FIG. 3. In FIG. 4 and FIG. 5, there is illustrated infrared spectrum for Sample A'. FIG. 5 is the portion in FIG. 4 encircled with a dotted line which is enlarged 5 times.

In the relation between α and $\rho_P/\rho_D$ in FIG. 3, as α of each of Samples A, B, C and D, α of each of Samples A', B', C' and D' is used. Since Samples A'–D' and Samples A–D are prepared in the exactly same manner as to conditions and order of steps except that the support is different from each other, the both α's can be believed to be the same.

As is clear from Table 1 and FIG. 3, a photoconductive layer of the present invention having α ranging from 0.2 to 1.0 shows an excellent photosensitivity and a photo-responsing property and can be widely used.

Definition and measuring method of photosensitivity and photo-responsing property are shown below.

Photosensitivity

Photosensitivity = $\rho_P/\rho_D$
$\rho_D$(Dark conductivity)$v \cdot cm^{-1}$ ... Electric conductivity in the dark
$\rho_P$(Light conductivity)$v \cdot cm^{-1}$ ... Electric conductivity when light is irradiated Photo-responsing property Photo-responsing property is evaluated by a light responsing time, that is, a time during which a photocurrent value changes from 10% to 90% assuming that the saturated value of the photocurrent responsing curve is 100% when the sample is irradiated by light.

Preparation of samples and measurement thereof

An electrode mask of a comb type having a predetermined pattern is placed on an a-Si:H layer which is formed on a support in a way as mentioned above, and metallic aluminum is vapor-deposited in the thickness of 2500 Å thereon under a pressure of $1 \times 10^{-4}$ Pa.

Shape of the resulting comb type electrode is 0.25 mm wide and 2.5 mm long.

To the resulting comb type electrode is applied a voltage of 10 V, and the dark current is measured by an electrometer (Keithley 610C, tradename, supplied by Keithley Co.) and $\rho_D$ is calculated.

On the other hand, $\rho_P$ is obtained by using He-Ne laser at a light irradiation energy of 1 mW/cm², applying a voltage of 10 V to the comb type electrode in a way similar to the measurement of dark current, measuring the resulting photocurrent by the above-mentioned electrometer and calculating $\rho_P$.

Calculation of the intensity ratio, α, of peak A to peak B

Infrared absorption spectrum (IR spectrum) for each sample is obtained by using an infrared Fourier transform spectroscopy (tradename, FTS 15 C/D-Type, supplied by Jasco International Co., Ltd.) for enhancing measuring accuracy.

Calculation of the intensity ratio, α, of peak A to peak B from IR spectrum is made by measuring $I_A$ and $I_B$ according to "Base-line" method (Practical Spectroscopy Series, Vol. 1, "Infrared and Roman Spectroscopy" (in three parts), Part A, pages 60–67, Marcel Dekker, Inc., New York and Basel) which is usually employed in infrared spectrum measuring field.

TABLE 1

| Sample | Photosensitivity $\sigma_P/\sigma_D$ | Photo-responsing (msec.) | Sample | α |
|---|---|---|---|---|
| A | $1.0 \times 10^6$ | 0.1 | A' | 0.52 |
| B | $7.8 \times 10^4$ | 0.4 | B' | 0.75 |
| C | $5.2 \times 10^4$ | 1 | C' | 0.92 |
| D | $1.4 \times 10^4$ | 1.2 | D' | 0.17 |

What we claim is:

1. A hydrogenated amorphous silicon photoconductive layer formed on a support, said layer exhibiting infrared absorption peaks at $880 \pm 10$ cm$^{-1}$ corresponding to a normalized mode of a bending mode of an SiH$_2$ bond and having an intensity $I_A$ and at $970 \pm 10$ cm$^{-1}$ corresponding to the overlap of a peak of a normalized mode of a deformation mode of an SiH bond and a peak which an Si–O bond is concerned and having an intensity $I_B$, wherein the ratio, $I_A/I_B$, is not more than 1.0.

2. A hydrogenated amorphous silicon photoconductive layer according to claim 1 in which the ratio, $I_A/I_B$, is not more than 0.9.

3. A hydrogenated amorphous silicon photoconductive layer according to claim 1 in which the ratio, $I_A/I_B$, is not more than 0.8.

4. A hydrogenated amorphous silicon photoconductive layer according to claim 1 in which the ratio, $I_A/I_B$, is in the range of 0.2–1.0.

5. A hydrogenated amorphous silicon photoconductive layer according to claim 1 in which the ratio, $I_A/I_B$, is in the range of 0.3–0.9.

6. A hydrogenated amorphous silicon photoconductive layer according to claim 1 in which the ratio, $I_A/I_B$, is in the range of 0.4–0.9.

7. A hydrogenated amorphous silicon photoconductive layer according to claim 1 in which said support is a conductive support.

8. A hydrogenated amorphous silicon photoconductive layer according to claim 1 in which said support is an insulating support.

9. A hydrogenated amorphous silicon photoconductive layer according to claim 8 in which said insulating support has a conductive coating thereon on which said photoconductive layer is formed.

* * * * *